United States Patent
Tel et al.

(10) Patent No.: US 6,879,866 B2
(45) Date of Patent: Apr. 12, 2005

(54) METHOD, COMPUTER PROGRAM PRODUCT AND APPARATUS FOR SCHEDULING MAINTENANCE ACTIONS IN A SUBSTRATE PROCESSING SYSTEM

(75) Inventors: Wim Tjibbe Tel, Helmond (NL); Harm Roelof Rossing, Nijmegen (NL); Suzan Leonie Auer-Jongepier, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/633,307

(22) Filed: Aug. 4, 2003

(65) Prior Publication Data

US 2005/0033463 A1 Feb. 10, 2005

(51) Int. Cl.$^7$ .................. G06F 19/00; G06F 11/30; G06F 15/00; G21C 17/00
(52) U.S. Cl. .................. 700/100; 700/121; 702/184
(58) Field of Search .................. 700/99–103, 121; 702/177, 184

(56) References Cited

U.S. PATENT DOCUMENTS

| | | | |
|---|---|---|---|
| 6,368,985 B1 * | 4/2002 | Wakamiya et al. | 438/780 |
| 6,436,609 B1 * | 8/2002 | Park | 430/313 |
| 2002/0103563 A1 * | 8/2002 | Izawa et al. | 700/121 |
| 2003/0013213 A1 * | 1/2003 | Takano | 438/14 |

* cited by examiner

Primary Examiner—Leo Picard
Assistant Examiner—Ryan Jarrett
(74) Attorney, Agent, or Firm—Pillsbury Winthrop LLP

(57) ABSTRACT

A method of scheduling one or more maintenance actions in at least a part of a substrate processing system is provided. According to an embodiment, the method includes determining a gap in the flow of substrates in a part of the substrate processing system and scheduling one or more maintenance actions to be performed in another part of the substrate processing during a period associated with the gap. An increase of productivity of substrate processing can be achieved through a reduction in downtime in a substrate processing system by appropriate scheduling of maintenance actions.

31 Claims, 8 Drawing Sheets

METHOD, COMPUTER PROGRAM PRODUCT AND APPARATUS FOR SCHEDULING MAINTENANCE ACTIONS IN A SUBSTRATE PROCESSING SYSTEM

FIELD

The present invention relates to performance of maintenance actions for apparatus used in substrate processing.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from United States patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic apparatus can be used, for example, in the manufacture of integrated circuits (ICs). In such, a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus, each target portion is irradiated by exposing the entire mask pattern onto the target portion at one time; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from United States patent U.S. Pat. No. 6,046,792, incorporated herein by reference.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in United States patent U.S. Pat. No. 5,969,441 and PCT patent application WO 98/40791, both incorporated herein by reference.

In a substrate processing system (an embodiment of which is sometimes known as a lithography cell), typically comprising a lithographic apparatus and a track, maintenance must be performed on occasion to ensure that the machines in the substrate processing system continue to operate properly. For example, in a lithographic apparatus, calibrations that must be performed on a regular basis (e.g. once an hour, once a day) can be started automatically by a maintenance scheduler of the lithographic apparatus. Thus, in an implementation, each particular maintenance has a time interval associated with it (e.g. once a day). In many cases, if the time since last execution of a particular maintenance approaches its time interval value, the particular maintenance will be started, for example, after the processing of the substrates in the lithographic apparatus has finished and the lithographic apparatus has been cleared of material. The same applies for (arts of) a track.

A problem that has been identified is that the performance of such maintenance can lead to productivity losses in substrate processing (e.g., coating, exposing and developing). One such loss in productivity is because the maintenance causes all or part of the substrate processing system to (temporarily) stop processing substrates (hereinafter referred to as a "maintenance action"). That problem can be exacerbated when a gap in the flow of the substrates has been created or is created for reasons other than due to that maintenance action.

As an example, an operator starting a track maintenance action typically does not have knowledge of whether a maintenance action is being performed for the lithographic apparatus (or any other relevant machines in the substrate processing system) or of when a maintenance action will be performed for the lithographic apparatus (or any other relevant machines in the substrate processing system). Similarly, the lithographic apparatus (or its operator) does not have knowledge of whether a maintenance action is being performed for the track (or any other relevant machines in the substrate processing system) or of when a maintenance action will be performed for the track (or any other relevant machines in the substrate processing system). It will therefore frequently occur, for example, that a track maintenance action is performed in a gap between two substrates in the substrate flow passing through the track and a lithographic apparatus maintenance action is performed in a gap between another two substrates in the substrate flow passing through the lithographic apparatus. Thus, instead of taking a single productivity penalty for performing the track and lithographic apparatus maintenance actions during a period associated with one of the referenced gaps (for example, performing the lithographic apparatus and track maintenance actions in parallel), a productivity penalty is taken for each of the lithographic and track maintenance actions when they are not performed during a period associated with one of the referenced gaps.

SUMMARY

It is an object of the present invention to improve maintenance scheduling during substrate processing.

According to an aspect of the invention, there is provided a method of scheduling one or more maintenance actions in at least a part of a substrate processing system, comprising:

determining a gap in the flow of substrates in a part of the substrate processing system; and scheduling one or more maintenance actions to be performed in another part of the substrate processing during a period associated with the gap.

Scheduled or schedulable downtime (for maintaining a part of a substrate processing system) can be triggered during a period associated with an interruption (gap), caused for any reason, in the flow of substrates in at least a part of the substrate processing system. An increase of productivity of substrate processing can be achieved through a reduction in downtime in a substrate processing system by appropriate scheduling of maintenance actions in conjunction with such a gap.

According to a further aspect of the invention, there is provided a computer program product to schedule one or more maintenance actions in at least a part of substrate processing system, comprising:

software code configured to determine a gap in the flow of substrates in a part of the substrate processing system; and software code configured to schedule one or more maintenance actions to be performed in another part of the substrate processing during a period associated with the gap.

According to a further aspect of the invention, there is provided a lithographic apparatus comprising:

an illuminator for providing a projection beam of radiation;

a support structure for supporting a patterning device, the patterning device serving to pattern the projection beam according to a desired pattern;

a substrate table for holding a substrate;

a projection system for projecting the patterned beam onto a target portion of the substrate; and a processing unit configured to determine a gap in the flow of substrates in a part of the substrate processing system and to schedule one or more maintenance actions to be performed in the lithographic apparatus during a period associated with the gap.

According to a further aspect of the invention, there is provided a track comprising:

a coater configured to apply a layer of radiation-sensitive material to a substrate;

a developer configured to develop an exposed substrate; and a processing unit configured to determine a gap in the flow of substrates in a part of a substrate processing system and to schedule one or more maintenance actions to be performed in the track during a period associated with the gap.

According to a further aspect of the invention, there is provided a method for initiating execution of maintenance actions in a track and a lithographic apparatus, comprising:

determining a gap in the flow of substrates in one of the track and the lithographic apparatus; and scheduling one or more maintenance actions to be performed in the other of the track and the lithographic apparatus during a period associated with the gap.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
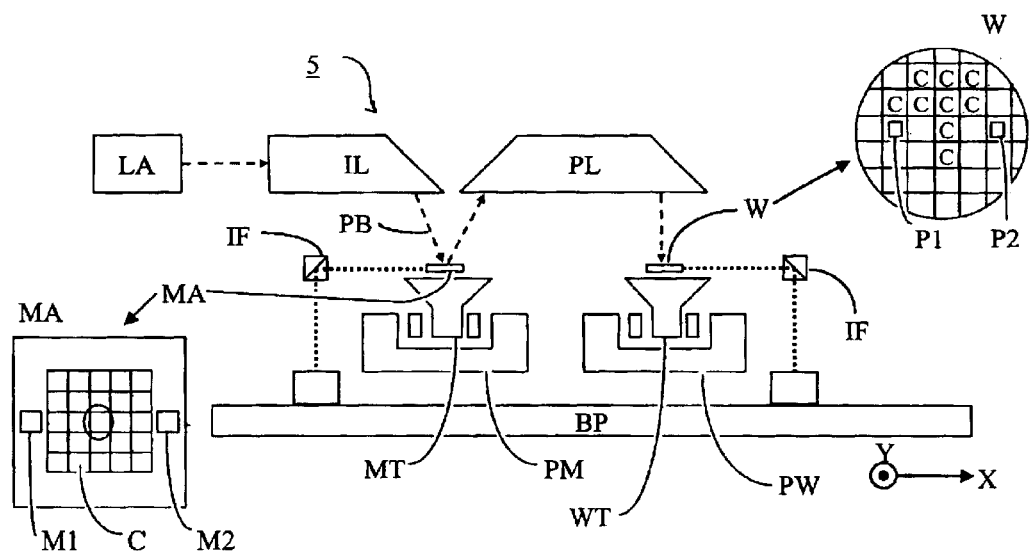
FIG. 1 depicts a lithographic apparatus according to an embodiment of the invention.

FIG. 1 schematically depicts a lithographic apparatus 5 according to a particular embodiment of the invention. The apparatus comprises:

a radiation system IL, for supplying a projection beam PB of radiation (e.g. EUV radiation). In this particular case, the radiation system also comprises a radiation source LA;

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (e.g. a resist-coated silicon wafer), and connected to second positioning means PW for accurately positioning the substrate with respect to item PL; and a projection system ("lens") PL (e.g. a mirror system) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a plasma source) produces a beam of radiation. This beam is fed into an illumination system (illuminator) IL, either directly or after having traversed conditioning means, such as a beam expander, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic apparatus (as is often the case when the source LA is a mercury lamp, for example), but that it may also be remote from the lithographic apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the projection system PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
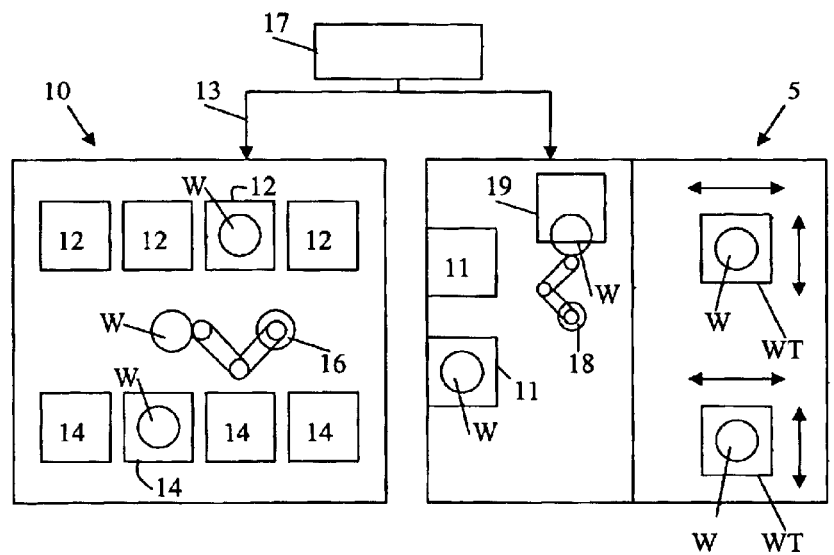
FIG. 2 depicts a schematic top view of a substrate processing system comprising a lithographic apparatus and a track according to an embodiment of the invention.

FIG. 2 depicts a schematic view of the handling processes of a substrate W in a substrate processing system. The substrate processing system as shown in FIG. 2 comprises two main parts: the track 10 and the lithographic apparatus 5, as described, for example, with reference to FIG. 1. Substrates W can be moved from the track 10 to the lithographic apparatus 5 and vice versa through a substrate handler port 1, of which two are shown in FIG. 2. The track 10 and the lithographic apparatus 5 are also shown connected to each other by a communications channel 13 and respectively to a processing unit 17. The communications channel 13 facilitates transfer of information between the track 10 and the lithographic apparatus 5. In an embodiment, the communications channel 13 also facilitates transfer of information between the processing unit 17 and the track 10 and between the processing unit 17 and the lithographic apparatus 5. The processing unit 17 typically comprises a microprocessor and appropriate software and will be described in more detail below. The processing unit 17 is not required if the track 10 and/or the lithographic apparatus 5 have a processing unit that can provide the capabilities of the processing unit 17 as described in more detail below.

The substrates W are placed in track process stations, of which eight are shown in FIG. 2. Four of these process stations are coaters 12 and four of these process stations are developers 14. In the coaters 12, the substrates W are coated with resist and in the developers 14 the exposed resist on the substrates are developed. Other processes can be carried out at the coaters, developers or other process stations (not shown) as will be known to a person skilled in the art.

The substrates W can be taken in and out of a process station 12,14 by a first substrate handler 16 positioned in the track 10. As an example, the first substrate handler 16 can obtain a substrate W from a coater 12 and then deliver the substrate W to a substrate handler port 11. Similarly, the first substrate handler 16 can obtain a substrate W from a substrate handler port 11 and then deliver the substrate W to a developer 14. Although not shown in FIG. 2, the first substrate handler 16 can also take a substrate W from a track input port (see FIGS. 3a and 3b) and deliver it to a process station 12, 14. Similarly, the first substrate handler 16 can also take a substrate W from a process station 12, 14 and deliver it to a track output port (see FIGS. 3a and 3b). The track input port and track output port can be one and the same port or a plurality of ports.

A second substrate handler 18, positioned in the lithographic apparatus 5, transports a substrate W within the lithographic apparatus 5. As an example, the second substrate handler 18 can obtain the substrate W from a substrate handler port 11 and then deliver the substrate W to a pre-aligner 19 and/or to a substrate table WT. The pre-aligner 19 is used, for example, to accurately control the position of the substrate W with respect to the second substrate handler 18. A substrate table WT, of which two are shown in FIG. 2, can be positioned (for example, as indicated by the arrows), in order to move the substrate W during an exposure and/or alignment procedure. The second substrate handler 18 can also obtain the substrate W from a substrate table WT and transport it to a substrate handler port 11.

Figure 3A:
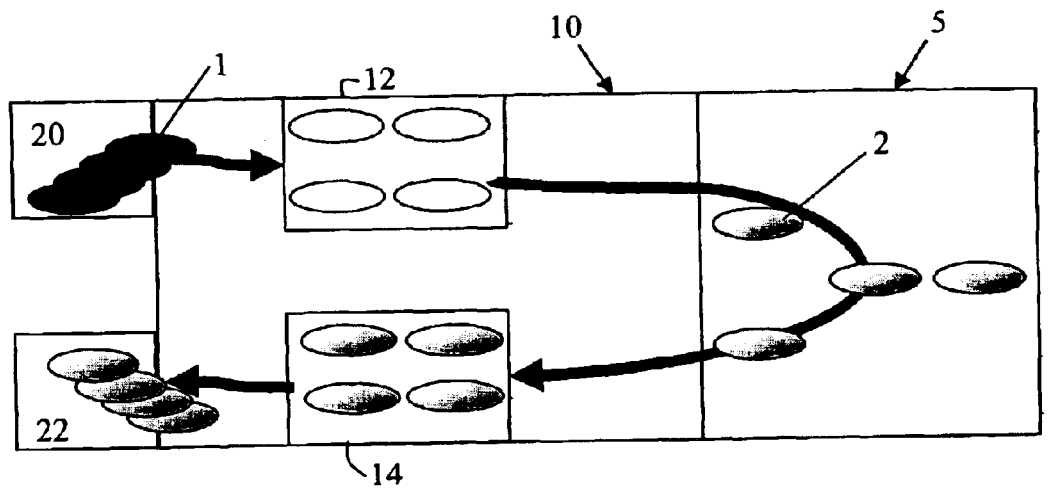
FIGS. 3a and 3b depict a schematic flow of substrates through a substrate processing system according to an embodiment of the invention.
Figure 3B:
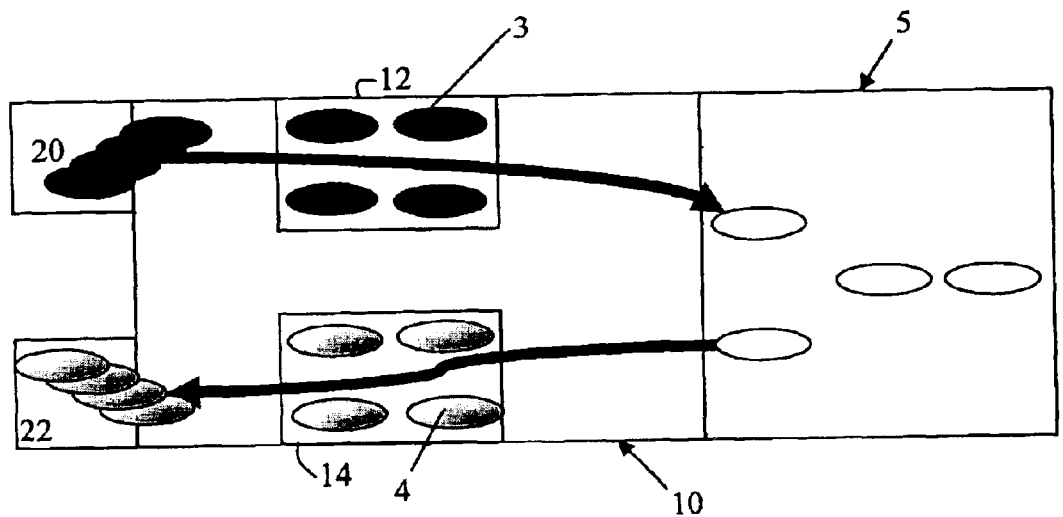

FIGS. 3a and 3b depict a schematic flow of substrates through a substrate processing system according to an embodiment of the invention. One or more substrates (wafers) are provided to track input port 20 and flow towards coaters 12 of the track 10. After the coaters 12, the substrates flow toward the lithographic apparatus 5 where the substrates are exposed. After completion of exposure, the substrates flow towards the developers 14 and then out of the track 10 through track output port 22. The result is a stream of substrates flowing through the substrate processing system for processing.

In FIG. 3a, an example of a gap in the flow of substrates caused by a maintenance action in the track 10 is shown affecting the flow of substrates through the substrate processing system. In this example, coaters 12 are taken down for routine maintenance. As can be seen, the substrates entering the coaters 12 is stopped (as represented by the dark shaded substrates) while the existing substrates in the substrate processing system continue to flow through the substrate processing system (as represented by the light shaded substrates). In an uncommon circumstance, all the substrates may stop in the substrate processing system. Due to the coater maintenance, a gap between substrates 1 and 2 is created which reduces the productivity of the substrate processing system.

In FIG. 3b, an example of a gap in the flow of substrates caused by maintenance action in the lithographic apparatus 5 is shown affecting the flow of substrates through the substrate processing system. In this example, the lithographic apparatus 5 is taken down for routine maintenance. As can be seen, the substrates entering the lithographic apparatus 5 are stopped (as represented by the dark shaded substrates) while the existing substrates in the substrate processing system continue to flow through the substrate processing system (as represented by the light shaded substrates), in an uncommon circumstance, all the substrates may stop in the substrate processing system. Due to the lithographic apparatus maintenance, a gap between substrates 3 and 4 is created which reduces the productivity of the substrate processing system.

As can then be understood from FIGS. 3a and 3b, substrate processing in the substrate processing system loses productivity due to the gaps between substrates 1 and 2 and substrates 3 and 4 caused respectively by a maintenance action in the track and the lithographic apparatus. A gap should be understood to include a spacing between two substrates, in a part of the substrate processing system, that exceeds a defined or accepted spacing between the substrates during processing in the referenced part of the substrate processing system. Such spacing may be measured, for example, in terms of time, distance and number of process positions in the substrate processing system.

Furthermore, while gaps have been described above as being caused by maintenance actions, a gap in the flow of substrate may be due to any reason. For example, a gap in the flow of substrates in at least a part of the substrate processing system may be due to logistics (possibly user induced) such as untimely delivery of substrates (and other materials, e.g., masks) to the substrate processing system. A gap in the flow of substrates may also be caused by unscheduled downtime or interrupts in a part of the substrate processing system. A gap in the flow of substrates could also be caused by processing time and its variations in at least a part of the substrate processing system such as due to system timing variations, bottlenecks (i.e., a part of the substrate processing system always has a gap due to the operation of another part of the substrate processing system) and substrate recipes (which could lead to the shift of a bottleneck from one part of the substrate processing system to another).

Accordingly, where a gap occurs in the flow of substrates in a part of the substrate processing system, it would be advantageous to schedule and perform one or more maintenance actions in the track and/or lithographic apparatus to occur in a period associated with that gap in substrate processing. This could reduce overall downtime of the substrate processing system by taking advantage of the gap in the flow of substrates. Optimally, the period corresponds to the full gap but the period may also be a part of the gap.

Where the flow of substrates continues in another part of the substrate processing system upon the occurrence of the gap, it would be advantageous for the one or more maintenance actions to be scheduled to be performed when all or part of the gap is at a part of the substrate processing system where the scheduled one or more maintenance actions are to be performed. Where the flow of substrates in the whole or another part of the substrate processing system is stopped upon the occurrence of the gap, it would be advantageous to schedule and perform one or more maintenance actions in at least a part of the substrate processing system such that the one or more maintenance actions occur fully or at least partly in parallel with the gap. As referred to herein, maintenance actions refer to maintenance processing that (temporarily) stops all or part of the substrate processing in the substrate processing system. Maintenance that occurs during substrate processing but that does not (temporarily) stop the all or part of the substrate processing (and is not dependent on maintenance actions that stop all or part of the substrate processing) may be performed as needed and does not require specific scheduling as discussed herein. Maintenance actions include without limitation calibrations, cleaning, replacement of expendable parts, etc.

In a track as well as in a lithographic apparatus, a number of maintenance actions can be scheduled and automatically performed. For example, many maintenance actions, such as calibrations, cleaning, etc., are executed at regular intervals such as once every certain number of wafers or once every certain number of hours. Moreover, the exact moment of the execution of most, if not all, such maintenance actions can be to some extent flexible, i.e., they can be scheduled. For example, a calibration may have to be executed at least once a day but the exact moment of the calibration can be shifted within a certain time range. Furthermore, many maintenance actions can be executed without human intervention, i.e., they do not need to be operated or started by an operator.

According to an embodiment, improved scheduling of maintenance actions to reduce downtime of a substrate processing system can be implemented by monitoring for a gap in the flow of substrates through a part of the substrate processing system. Once a gap is identified, one or more other maintenance actions can be scheduled and performed to occur within the substrate processing system to take advantage of the gap.

In one variant, when the flow of substrates through all or another part of the substrate processing system stops upon the occurrence of the gap, one or more maintenance actions can be scheduled and performed to occur fully or at least partly in parallel with that gap. In other words, the one or more maintenance actions can be scheduled and performed to occur in a time period associated with the gap that stops substrate processing. For example, referring to FIG. 3a, when a gap occurs due to the maintenance of the coaters 12 and the flow of substrates throughout the substrate processing system is stopped, one or more maintenance actions that can be performed at substantially the same time in the coaters or any other part of the substrate processing system, such as the lithographic apparatus 5, can be carried out. Similarly, when the gap occurs due to the maintenance of the coaters 12 and the flow of substrates before the coaters 12 is stopped, one or more maintenance action that can be performed at substantially the same time in the coaters or in a part of the substrate processing system before the coaters, can be carried out. The gap in the flow of substrates at the coaters can be identified using status information about the substrates in the substrate processing system such as defined by Semiconductor Equipment and Materials International's (SEMI) E90 standard. The SEMI E90 standard defines, for example, an interface that provides information on where in the substrate processing system a substrate is being processed. As will be apparent, any other means of communication, other than the SEMI E90 standard, could be used to communicate the status information. By checking the SEMI interface, the time and location of substrates at the coaters can be identified and a gap between substrates determined. For example, whenever gaps are detected in the flow of substrates with an expected duration of more than a certain amount time, scheduling of one or more maintenance actions as described below can be triggered. Similar information can be provided by the lithographic apparatus and/or other machines in the substrate processing system.

Processing unit 17 (or a processing unit of the lithographic apparatus 5 and/or track 10) can determine which one or more maintenance actions in the track and/or lithographic apparatus can be carried out immediately or scheduled to be commenced shortly so as to occur fully or at least partly in parallel with the gap. The length of the gap may be known and/or determined. For example, the length of the gap can be determined by performing a database lookup based on the location in the substrate processing system and/or time of the occurrence of the gap. The lookup directly or indirectly identifies the cause of the gap and accordingly identifies the length of the gap. The length of the gap may also be provided by the apparatus in the substrate processing system where the gap occurred, perhaps part of the information about the time and location of processing of a substrate. Knowing the length of the gap or not, one or more appropriate maintenance actions can be scheduled and carried out during all or part of the gap. In some circumstances, appropriate conversions may be required between the length of the gap and the maintenance actions that can be scheduled for the gap. For example, the gap may be measured in time but certain maintenance actions may be carried out every certain number of substrates (plus or minus a certain range of substrates). In that case, either the gap time or the maintenance action schedule will need to be adapted into the measurement unit of the other or otherwise adapted to another measurement unit so as to be able to properly schedule the one or more maintenance actions for the gap.

In another variant, where a gap occurs in a part of the substrate processing system but the flow of substrates continues in another part of the substrate processing system, one or more maintenance actions can be scheduled to be performed when all or part of the gap is at a part of the substrate processing system where the scheduled maintenance actions are to be performed. In other words, the one or more maintenance actions can be scheduled and performed to occur in a period (i.e., all or part of the gap) associated with the gap. This variant can be implemented by identifying where in the substrate processing system the gap occurred with respect to one or more substrates using, for example, the SEMI E90 interface. Knowing the length of the gap or not, one or more maintenance actions can be scheduled and performed in a part of the substrate processing system when all or part of the gap reaches that part of the substrate processing system. Similarly to as discussed above with respect to scheduling maintenance actions to occur at least partly or fully in parallel with a gap, appropriate conversions may be required in some circumstances between the length of the gap and the maintenance actions that can be scheduled for the gap.

For example, referring to FIG. 3a, a maintenance action with respect so the coaters 12 causes a gap in the flow of substrates into the coaters 12. By checking the SEMI interface, the time and location of the gap between substrates at the coaters can be identified. The processing unit 17 (or a processing unit of the lithographic apparatus 5 and/or track 10) can determine or monitor when the gap in the processing of substrates reaches a part of the substrate processing system where another maintenance action can be performed. So, knowing when a substrate that just passed the point of occurrence of the gap, i.e. the coaters, will reach another part of the substrate processing system, e.g., the exit of the lithographic apparatus 5, a maintenance can be scheduled for and performed when that substrate reaches, is in or leaves that other part of the substrate processing system.

As an example, coaters maintenance may be long enough to perform a maintenance action in the lithographic apparatus. Accordingly, the substrate that just passed the point of occurrence of the gap can be monitored to determine when it reaches a point at, in or out of the lithographic apparatus so that a maintenance action can be performed in the lithographic apparatus that takes advantage of all or part of the gap that follows that substrate. In a typical example, the substrate would be monitored to determine when it exits the lithographic apparatus at which point the lithographic apparatus would be available to perform a maintenance action until the first substrate reaches the lithographic apparatus after the completion of the coaters maintenance.

To facilitate scheduling of an appropriate maintenance action during all or part of the gap, the length of the gap may be known and/or determined. Knowing the length of time of the gap, one or more appropriate maintenance actions can be determined and carried out during all or part of the gap. The length of the gap can be determined, for example, by performing a database lookup as described above. The length of the gap can also be identified by comparing when the first substrate passes the location of the start of the gap with when the last substrate passed the location of the start of the gap. If the first substrate passes the location of the start of the gap far enough in advance, one or more maintenance actions could be scheduled and performed "downstream" to take advantage of all or part of that gap. The length of the gap could also simply be a running time from when the last substrate passed the location of the start of the gap. The possible maintenance action(s) that can be scheduled and performed to occur in the running time can then be determined. A maintenance action scheduled based on one instance of the running time could be overridden if another instance of the running time becomes long enough for another, more appropriate schedulable maintenance action.

Figure 4A:
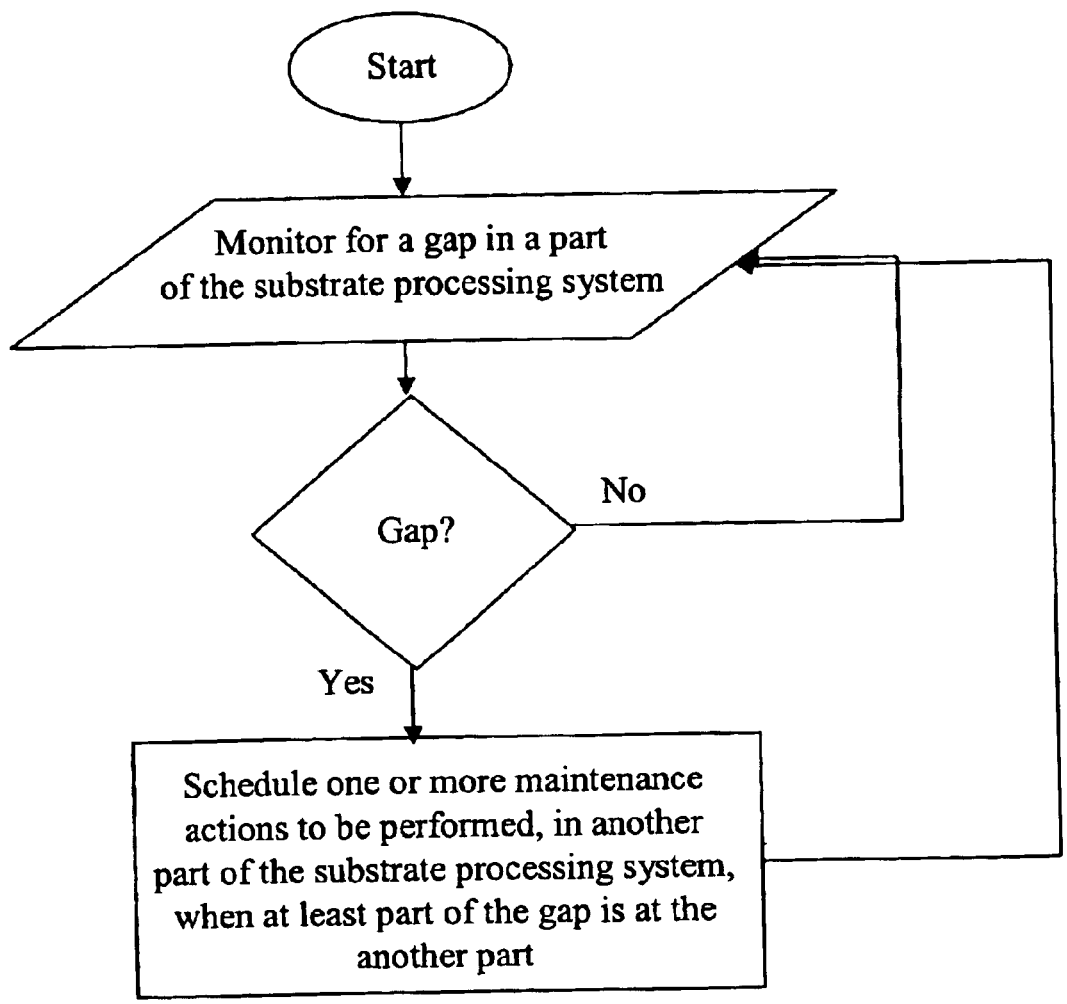
FIGS. 4a to 4e depict flowcharts of maintenance scheduling according to embodiments of the invention.
Figure 4B:
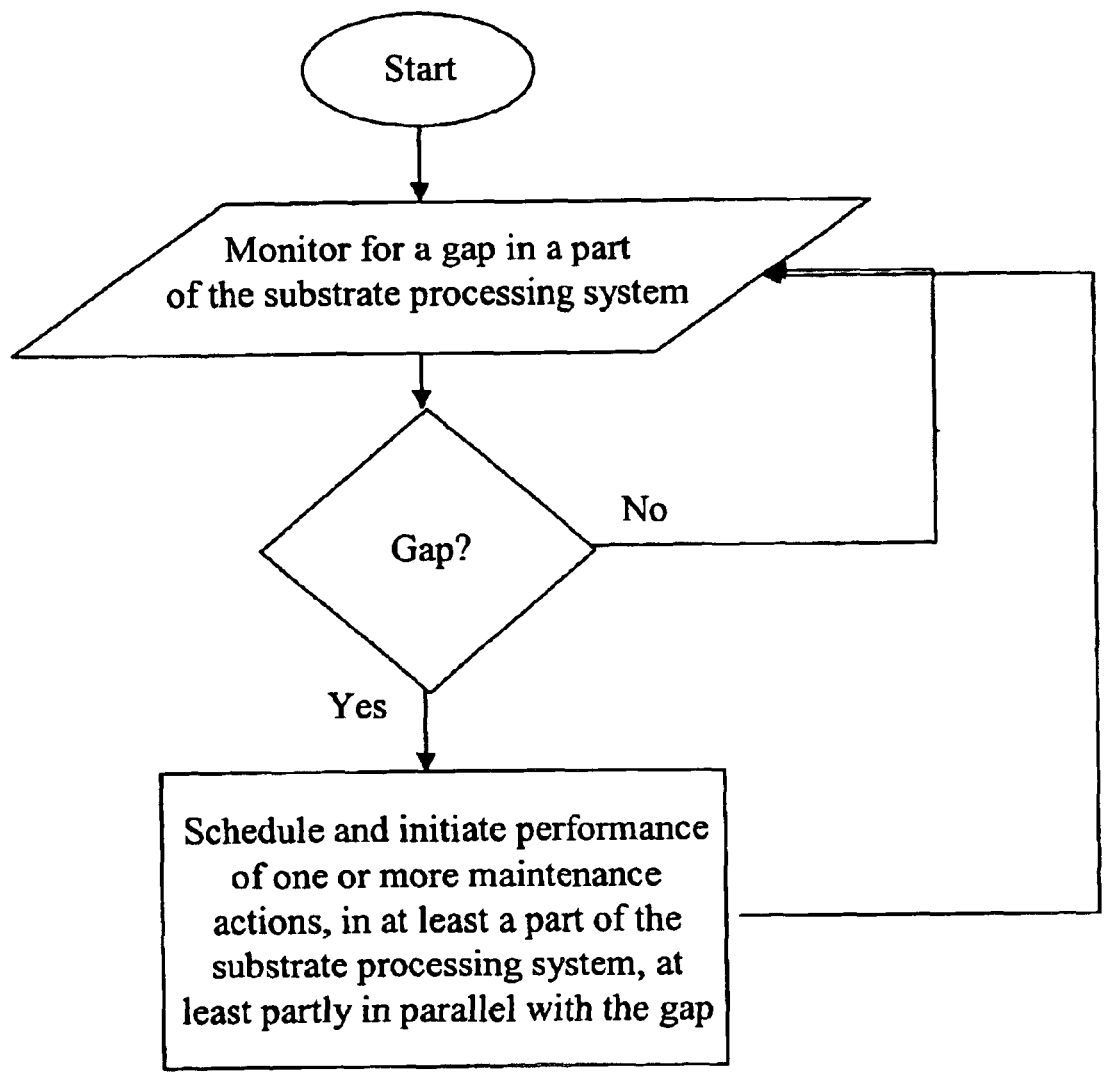

FIGS. 4a and 4b depict flowcharts of maintenance scheduling according to implementations of this embodiment of the invention. The variants described above and the implementations depicted in FIGS. 4a and 4b may be combined together, if appropriate. This embodiment can be of advantage where there is no or incomplete information about maintenance actions, where not every part of the substrate processing system can have maintenance actions scheduled or adjusted, where there is no fill communication between parts of the substrate processing system and/or where one part of the substrate processing system cannot control another part of the substrate processing system. For example, in this embodiment, a part of the substrate processing system, such as the lithographic apparatus or the track, can provide the improved maintenance thus avoiding the need for the processing unit 17. Further, considering the lithographic apparatus example, the lithographic apparatus does not require maintenance action information from the track or other parts of the substrate processing system as it can make maintenance action scheduling determinations based on the location and/or time of the gap in the flow of substrates in the substrate processing system using conventional information. Additionally, the lithographic apparatus need not control scheduling and/or performance of maintenance actions in (or otherwise communicate at all with) the track or other parts of the substrate processing system as it could simply only schedule maintenance actions to be performed in the lithographic apparatus.

According to another embodiment, improved scheduling of maintenance actions to reduce downtime of a substrate processing system can be implemented using information about the performance of a maintenance action in the substrate processing system and/or using information about the performance of another activity associated with the substrate processing system, either or both which cause a gap in the flow of substrate flow in a part of the substrate processing system. Once a maintenance action and/or other activity is identified as being performed or to be performed, one or more other maintenance actions can be scheduled and performed to occur within the substrate processing system to take advantage of the gap due to that maintenance action and/or other activity.

In this embodiment, one or more parts of the substrate processing system, such as the lithographic apparatus and/or track, provide information about maintenance actions and/or other activities that are being performed or about to be performed. For example, the maintenance action information can include information on timing of the maintenance action such as when the maintenance action is to be performed or simply an indication that a maintenance action is being performed. Further, the maintenance action information could provide information about the length of the gap that would be introduced by the maintenance action including the length of the gap or simply an indication that a maintenance action has stopped, i.e., finished or discontinued. Other activity information can include information about bottlenecks, recipe changes, delays in delivery of substrates or other materials to the substrate processing system, etc.

Accordingly, one or more maintenance actions can be scheduled and performed to occur during a period associated with the gap based on such maintenance action and/or other activity information. For example, in one variant, when the flow of substrates through the all or part of the substrate processing system stops due to a maintenance action identified by maintenance action information, one or more maintenance actions can be scheduled and performed to occur fully or at least partly in parallel with the gap due to that maintenance action. In another variant, where a gap occurs in the flow of substrates in a part of the substrate processing system but the flow of substrates continues in another part of the substrate processing system, the gap introduced into the flow of substrates through the substrate processing system due to the maintenance action is identified using the maintenance information. Then, one or more maintenance actions can be scheduled to be performed when all or part of the gap is at a part of the substrate processing system where the scheduled maintenance actions are to be performed. In other words, in each variant, the one or more maintenance actions can be scheduled and performed to occur in a period associated with a gap due to the maintenance action.

In an implementation, the processing unit 17 (or a processing unit of the lithographic apparatus 5 and/or track 10)

can process the maintenance action and/or other activity information received from one or more parts of the substrate processing system and determine which one or more maintenance actions in the substrate processing system can be scheduled and performed to occur to take advantage of the gap identified by the maintenance action and/or other activity information. Where the maintenance action and/or other activity information does not identify the length of the gap, the length of the gap may be known and/or determined as described in detail above.

Figure 4C:
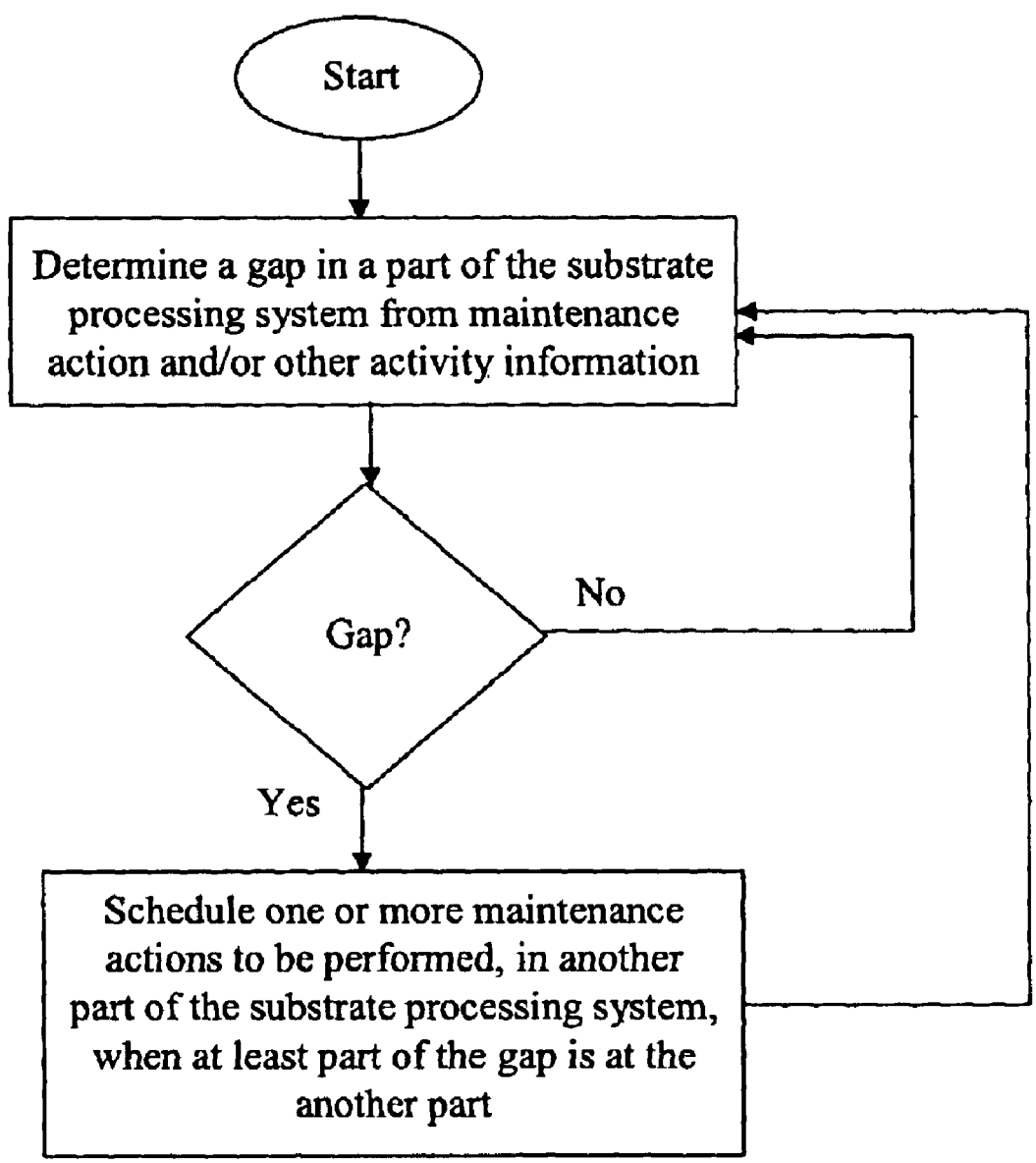
Figure 4D:
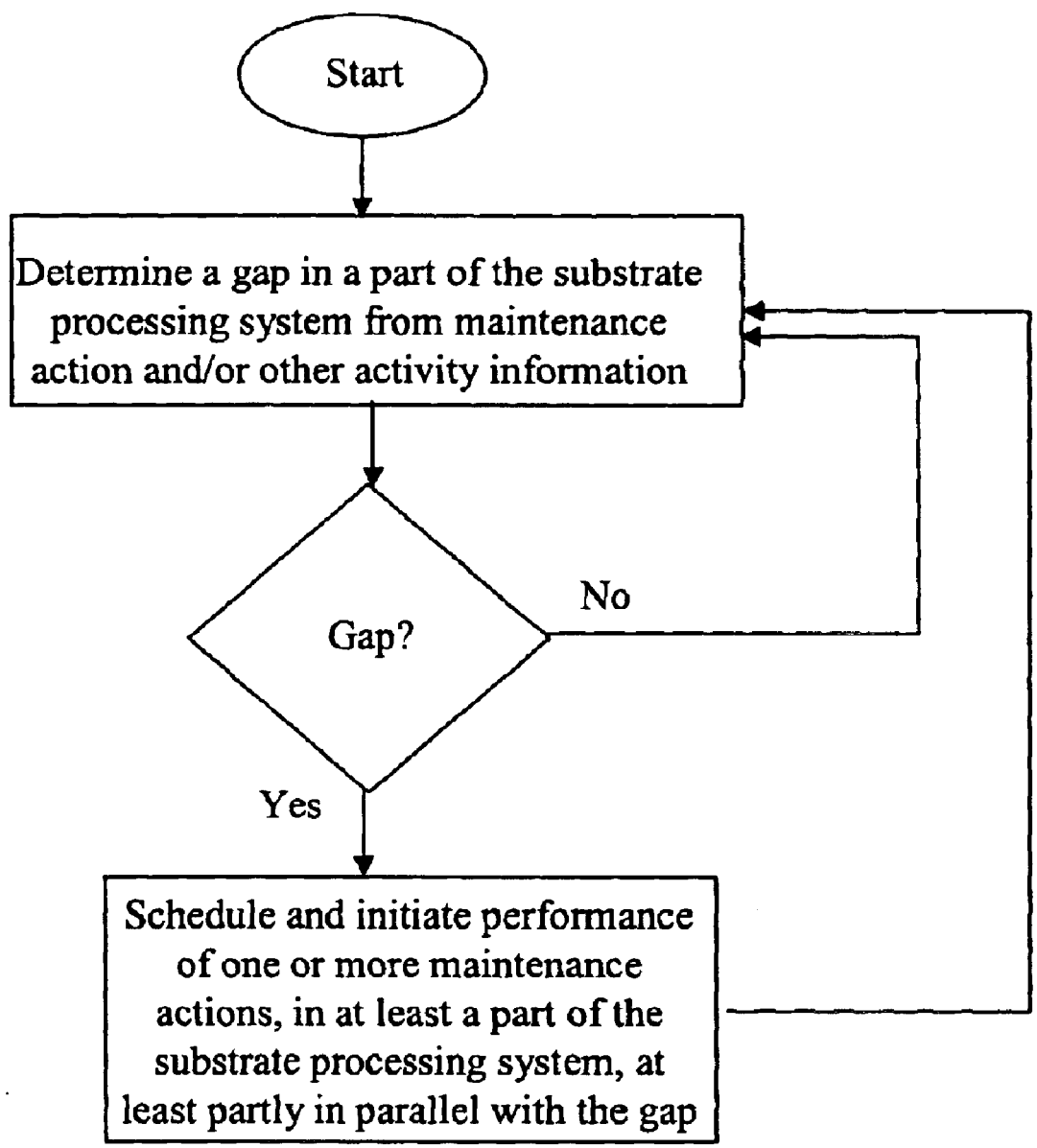

FIGS. 4c and 4d depict flowcharts of maintenance scheduling according to implementations of this embodiment of the invention. The variants described above and the implementations depicted in FIGS. 4c and 4d may be combined together, if appropriate. This embodiment can be of advantage where not every part of the substrate processing system can have maintenance actions scheduled or adjusted, where there is no full communication between parts of the substrate processing system and/or where one part of the substrate processing system cannot control another part of the substrate processing system. For example, in this embodiment, a part of the substrate processing system, such as the lithographic apparatus or the track, can provide the improved maintenance thus avoiding the need for the processing unit 17. Further, considering the lithographic apparatus example, the lithographic apparatus need not control scheduling and/or performance of maintenance actions in (or otherwise communicate at all with) the track or other parts of the substrate processing system as it could simply only schedule maintenance actions to be performed in the lithographic apparatus based on maintenance action and/or other activity information received from other parts of the substrate processing system. Although this embodiment needs maintenance action and/or other activity information, the scheduling and performance of one or more maintenance actions during a period associated with a gap in the flow of substrates can be improved as more complete, accurate and/or timely information could be available in comparison to the substrate status information of the previous embodiment.

According to another embodiment, improved scheduling of maintenance actions to reduce downtime of a substrate processing system can be implemented using a scheduler to control performance of maintenance actions in the substrate processing system. With information about some or all of the maintenance actions to be performed in the substrate processing system and/or information about other activities that can cause a gap in the flow of substrate in a part of the substrate processing system, one or more maintenance actions can be scheduled (through the scheduler) and performed to occur within the substrate processing system in order to take advantage of a gap due to a maintenance action in the substrate processing system or due to another activity.

In this embodiment, the parts of the substrate processing system, such as the track and lithographic apparatus, provide information on which maintenance actions will be due at which point and the duration of those maintenance actions and/or provide information on which other activities will occur at which point and, if applicable, the duration of those activities or the length of a gap in the flow of substrates caused by the other activity. The parts of the substrate processing system can provide this information to the scheduler and/or allow the information to be retrieved by the scheduler. An example of maintenance action information includes information on the action to be performed, the time when such action must or should be performed (e.g., in the next 100 wafers) including a scheduling window if available (e.g., in the next 100 wafers plus or minus 10 wafers), any dependencies (e.g., a certain maintenance action must be performed before another specific maintenance action), any related actions (e.g. substrates must be cleared from the part of the substrate processing system before start of the maintenance action in that part), and the duration of performance of the maintenance action.

Further, the parts of the substrate processing system allow the scheduler (e.g., an outside host) to initiate maintenance actions in those parts of the substrate processing system. The scheduler schedules and activates performance of maintenance actions in some or all of the parts of the lithographic apparatus, such as the track and lithographic apparatus. While the scheduler would typically be separate from the parts of the lithographic apparatus, it is possible that the scheduler can be provided in a part of the lithographic apparatus such as the track or the lithographic apparatus provided appropriate communication channels are provided with the other parts of the substrate processing system.

In an implementation, the scheduler identifies a plurality of maintenance actions of the substrate processing system (1) that can be executed without operator intervention; (2) that are predictable when their execution is required; and (3) of which the exact moment of execution is flexible (i.e. they can be scheduled). With such maintenance actions identified, a subset (or perhaps all) of those maintenance actions are identified that can be scheduled and performed to take advantage of the gap in the flow of substrates due to a maintenance action in the substrate processing system and/or another activity. The identified maintenance action(s) can then be scheduled to occur in the substrate processing system during a period associated with the gap. Where applicable, the scheduler may need to account for dependencies and related actions of a maintenance action and/or other activity. In its scheduling, an aim of the scheduler is to keep productivity losses to a minimum and reduce the overall downtime of the substrate processing system.

As will be apparent, not all maintenance actions need to be flexible as to the moment of execution if those and other maintenance actions can be properly scheduled to occur in a period associated with a gap in the flow of substrates. For example, a particular maintenance action can be rigid as to its particular time of execution but still be used in scheduling if another maintenance action happens to be flexible enough to be scheduled for performance at least partly or fully in parallel with that particular maintenance action.

Any appropriate scheduling algorithm may be applied to schedule the performance of maintenance actions. The scheduling can be event-driven, just-in-time or full scheduling. In an event-driven model, the scheduler reacts to the occurrence of a maintenance action and/or other activity to schedule other maintenance actions to be performed in a period associated with the gap in the flow of substrates due to the maintenance action and/or other activity. In a just-in-time model, the scheduler knows of certain maintenance actions and/or other activities that will occur in the future and schedules other maintenance actions to be performed in a period associated with the gap in the flow of substrates due to that future maintenance action and/or other activity. In essence, the scheduler schedules around a defined set of maintenance actions and/or other activities. In a full schedule model, all or many of the maintenance actions are scheduled to occur at preferred times so as to maximize (or at least improve) the concurrence of maintenance actions. The scheduler defines the schedule of maintenance actions instead of reacting to maintenance actions and/or other activities or scheduling around a defined set of maintenance actions and/or other activities. In an implementation, the scheduler may switch between one or more of the models. For example, a full schedule model may be interrupted to an event-driven model where a user requests a maintenance action to be performed out of schedule. Also, in any model, the schedule may be configured to accept performance of a stipulated maintenance action at a certain time despite a more optimal scheduling of that maintenance action according to the methods described herein.

Figure 4E:
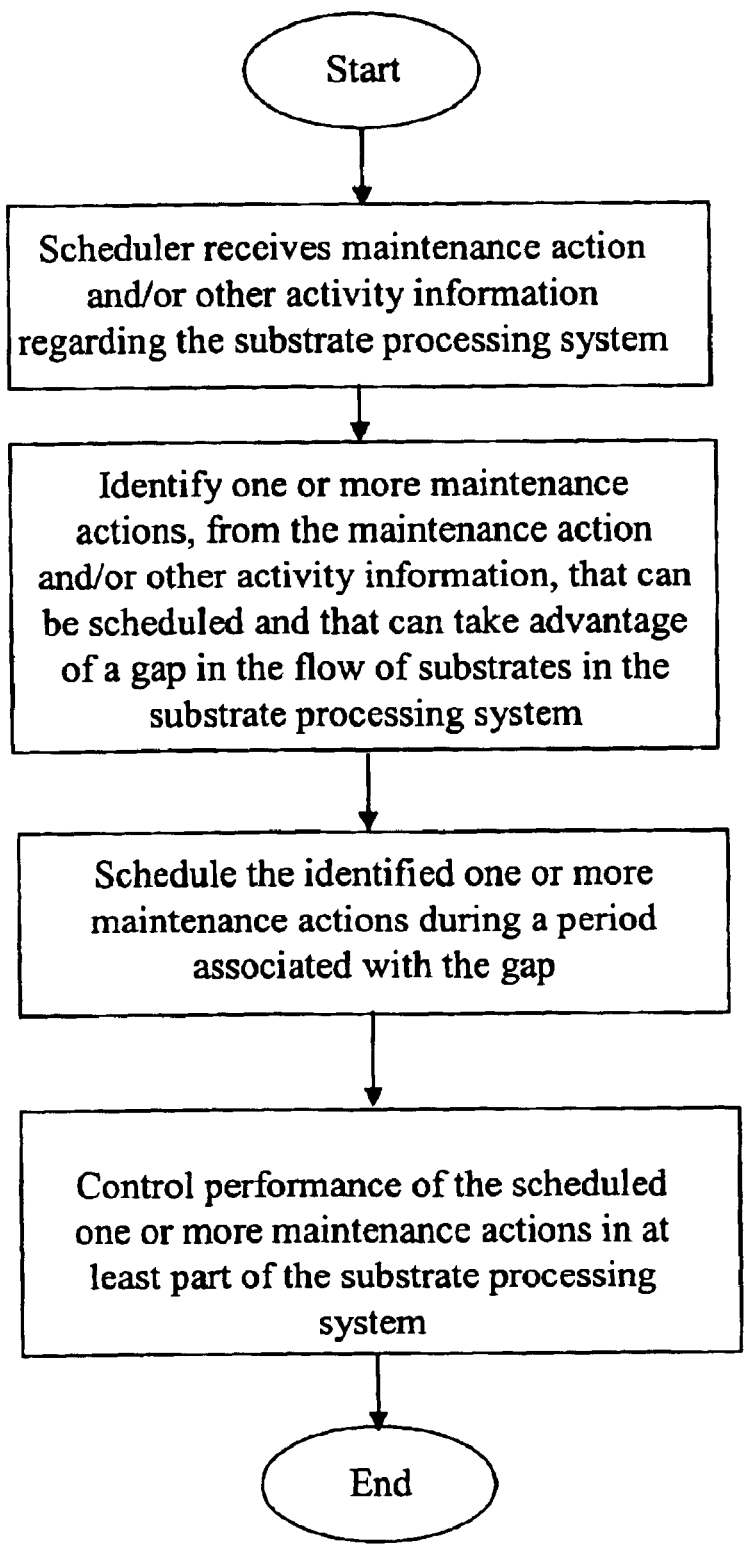

FIG. 4e depicts a flowchart of maintenance scheduling according to an implementation of this embodiment of the invention. This embodiment has the advantage of providing a robust scheduling solution at the possible disadvantage of requiring one or more parts of the substrate processing system to have maintenance actions that can be scheduled or adjusted, of having substantial communication with and/or between parts of the substrate processing system and of needing significant maintenance action and/or other activity information.

Figure 5:
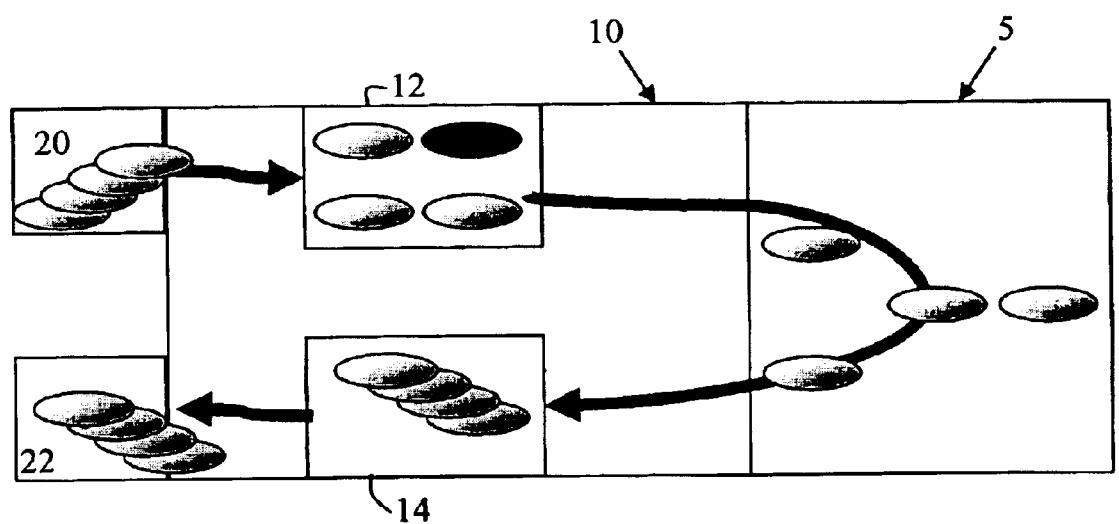
FIG. 5 depicts another schematic flow of substrates through a substrate processing system according to an embodiment of the invention.

Another maintenance scheduling feature is to avoid availability loss completely. This feature can be provided in addition to the maintenance scheduling described in more detail above. As an example, referring to FIG. 5, one out of the four coaters 12 of the track 10 is down for maintenance. No substrates enter the coater that is down for maintenance (as represented by the dark shaded substrate) but other substrates in the substrate processing system can and do continue to flow through the substrate processing system (as represented by the light shaded substrates). Accordingly to take advantage of the ability to continue the flow of substrates in the substrate processing system, the substrate processing flow can be scheduled and moved around this maintenance of the coater instead of stopping the flow of all substrates before the coater down for maintenance.

However, this kind of scheduling only works when multiples modules are available for a task; if there is only one module that can perform a particular required task and maintenance is performed at that module that stops substrate processing then substrate flow cannot be scheduled around that module. It should be noted however that the loss of a developer or a coater to maintenance can lead to an exchange of downtime loss for rate efficiency loss. Accordingly, a calculation should be made to calculate the productivity gain in a particular substrate processing system to determine whether such scheduling should be implemented.

An additional maintenance scheduling feature is to provide for scheduling of one or more dependent and/or desired maintenance actions, in a part of the substrate processing system, that is related to a maintenance action in another part of the substrate processing system. This feature can be provided in addition to the maintenance scheduling described in more detail above. As an example, a maintenance action, such as a calibration, may be performed or scheduled to be performed in the lithographic apparatus. According to this feature, one or more other dependent maintenance actions (e.g., necessary or recommended maintenance actions such as another calibration required to be performed before the performance of a scheduled calibration) and/or one or more desired maintenance actions (e.g., an optional maintenance action such as cleaning process before the performance of a scheduled calibration) can be scheduled in the track.

As noted earlier, the processing unit 17 typically comprises a microprocessor and appropriate software. The processing unit 17 is not required if the track 10 and/or the lithographic apparatus 5 have a processing unit that can provide the capabilities of the processing unit 17. Processing unit 17 will usually comprise software to perform the methods described above. In an embodiment, software to implement the methods described above is provided on an interface between a host system of the fab and the track and lithographic apparatus of a substrate processing system in the fab. Use is made of existing interfaces and protocols (e.g., SECS protocols and interfaces) provided by the host system and the machines of the substrate processing system.

More particularly, each step of the method may be executed on any general computer, such as a mainframe computer, personal computer or the like and pursuant to one or more, or a part of one or more, program modules or objects generated from any programming language, such as C++, Java, Fortran or the like. And still further, each step, or a file or object or the like implementing each step, may be executed by special purpose hardware or a circuit module designed for that purpose. For example, the invention may be implemented as a firmware program loaded into non-volatile storage or a software program loaded from or into a data storage medium as machine-readable code, such code being instructions executable by an array of logic elements such as a microprocessor or other digital signal processing unit.

The invention may be implemented as an article of manufacture comprising a computer usable medium having computer readable program code means therein for executing the method steps of the invention, a program storage device readable by a machine, tangibly embodying a program of instructions executable by a machine to perform the method steps of the invention, a computer program product, or an article of manufacture comprising a computer usable medium having computer readable program code means therein, the computer readable program code means in said computer program product comprising computer readable code means for causing a computer to execute the steps of the invention. Such an article of manufacture, program storage device, or computer program product may include, but is not limited to, CD-ROMs, diskettes, tapes, hard drives, computer system memory (e.g. RAM or ROM) and/or the electronic, magnetic, optical, biological or other similar embodiment of the program (including, but not limited to, a carrier wave modulated, or otherwise manipulated, to convey instructions that can be read, demodulated/decoded and executed by a computer). Indeed, the article of manufacture, program storage device or computer program product may include any solid or fluid transmission medium, magnetic or optical, or the like, for storing or transmitting signals readable by a machine for controlling the operation of a general or special purpose computer according to the method of the invention and/or to structure its components in accordance with a system of the invention.

The invention may also be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another apparatus (such a cellular telephone).

The system may be specially constructed for the required purposes to perform, for example, the method steps of the invention or it may comprise one or more general purpose computers as selectively activated or reconfigured by a computer program in accordance with the teachings herein stored in the computer(s). The system could also be implemented in whole or in part as a hard-wired circuit or as a circuit configuration fabricated into an application-specific integrated circuit. The invention presented herein is not inherently related to a particular computer system apparatus. The required structure for a variety of these systems will appear from the description given.

In the case of diagrams depicted herein, they are provided by way of example. There may be variation to these diagrams or the steps (or operations) described herein without departing from the spirit of the invention. For instance, in certain cases, the steps may be performed in differing order, or steps may be added, deleted or modified. All of these variations are considered to comprise part of the present invention as recited in the appended claims.

While specific embodiments of the invention have been described above, it will be appreciated that the invention may be practiced otherwise than as described. The description is not intended to limit the invention.

What is claimed is:

1. A computer-implemented method of scheduling one or more maintenance actions in at least a part of a substrate processing system, comprising:
    determining a gap in the flow of substrates in a part of the substrate processing system, other than a gap in the flow of substrates caused at introduction of substrates into the substrate processing system; and
    scheduling one or more maintenance actions to be performed in a part of the substrate processing system during a period associated with the gap.

2. The method according to claim 1, wherein determining a gap comprises monitoring for a gap in the flow of substrates through the substrata processing system.

3. The method according to claim 1, wherein the gap is determined using information about the performance of a maintenance action, another activity provided by one or more parts of the substrate processsing system, or both.

4. The method according to claim 1, wherein the gap is determined using a scheduler and the method further comprises controlling the performance of the one or more maintenance actions in a part of the substrate processing system using she scheduler.

5. The method according to claim 1, wherein the flow of substrates in all or part of the substrata processing system is stopped upon the occurrence of the gap and said scheduling comprises scheduling one or more maintenance actions to be performed in a part of the substrate processing system such that the one or more maintenance actions occur at least partly in parallel with the gap.

6. The method according to claim 1, wherein the flow of substrates continues in another pert of the substrate processing system upon the occurrence of the gap and said scheduling comprises scheduling one or more maintenance actions to be performed when at least a pert of the gap is at a part of the substrate processing system where the scheduled one or more maintenance actions are to be performed.

7. The method according to claim 1, wherein said substrate processing system comprises a lithographic apparatus and a track.

8. The method according to claim 5, wherein said scheduling is performed externally from the lithographic apparatus and the track.

9. A computer program product to schedule one or more maintenance actions in at least a part of a substrata processing system, comprising:
    software code configured to determine a gap in the flow of substrates in a part of the substrate processing system other than a gap in the flow of substrates caused at in introduction of substrates into the substrate processing system; and
    software code configured to schedule one or more maintenance actions to be performed in a part of the substrate processing system during a period associated with the gap.

10. The computer program product according to claim 9, wherein the code configured to determine a gap comprises code configured to monitor for a gap in the flow of substrates through the substrate processing system.

11. The computer program product according to claim 9, wherein the code configured to determine a gap comprises code to determine the guy using information about the performance of a maintenance action, another activity provided by one or more parts of the substrate processing system, or both.

12. The computer program product according to claim 9, comprising a scheduler configured to determine the gap and to control the performance of the one or more maintenance actions in part of the substrate processing system.

13. The computer program product according to claim 9, wherein the flow of substrates in all or pan at the substrate processing system is stopped upon the occurrence of the gap and said code configured to schedule comprises coda configured to schedule one or more maintenance actions to be performed in a part of the substrate processing system such that the one or one or more maintenance actions occur at least partly in parallel with the cap.

14. The computer program product according to claim 9, wherein the flow of substrates continues in another part of the substrate processing system upon the occurrence of the gap and said code configured to schedule comprises code configured to schedule one or more maintenance actions to be performed when at least a part of the gap is at a part of the substrate processing system where the scheduled one or more maintenance actions are to be performed.

15. The computer program product according to claim 9, wherein said substrate processing system comprises a lithographic apparatus and a track.

16. The computer program product according to claim 15, whereto said computer program product is operated externally from the lithographic apparatus and the track.

17. A lithographic apparatus comprising:
    an illumination system configured to provide a projection beam of radiation;
    a support structure configured to support a patterning device, the patterning device configured to pattern the projection beam according to a desired pattern;
    a substrate table configured to hold a substrate;
    a projection system configured the project the patterned beam onto a target portion of the substrate; and
    a processing unit configured to determine a gap in the flow of substrates in a part of a substrate processing system other than a gap in the flow of substrates caused at introduction of substrates into the substrate processing system, and to schedule one or more maintenance actions to be performed in the lithographic apparatus during a period associated with the gap.

18. The lithographic apparatus according to claim 17, wherein the processing unit is configured to monitor for a gap in the flow of substrates through the substrate processing system.

19. The lithographic apparatus according to claim 17, wherein the processing unit is configured to determine the gap using information about the performance of a maintenance action, and another activity provided by one or more parts of the substrate processing system, or both.

20. The lithographic apparatus according claim 17, wherein th processing tout comprises a scheduler the scheduler being configured to determine the gap and to control the performance of the one or more maintenance actions in the lithographic apparatus.

21. A track comprising:
   a coater configured to apply a layer of radiation-sensitive material to a substrate;
   a developer configured to develop an exposed substrate; and
   a processing unit configured to determine a gap in the flow of substrates in a part of a substrate processing system and to schedule one or more maintenance actions to be performed in the track during a period associated with the gap.

22. The track according to claim 21, wherein the processing unit is configured to monitor for a gap in the flow of substrates through the substrate processing system.

23. The track according to claim 21, wherein the processing unit is configured to determine the gap using information about the performance of a maintenance action and another activity provided by one or more pans of the substrate processing system, or both.

24. The track according to claim 21, wherein the processing unit comprises a scheduler, the scheduler configured to determine the gap and to control the performance of the one or more maintenance actions in the track.

25. A computer implemented method for initiating execution of maintenance actions in attack and a lithographic apparatus, comprising:
   determining a gap in the flow of substrates in a part of one of the track and the lithographic apparatus, other than a gap in the flew of substrates caused at introduction of substrates into the track and lithographic apparatus; and
   scheduling one or more maintenance actions to be performed in a part of the other of the track and the lithographic apparatus during a period associated with the gap.

26. The method according to claim 25, wherein determining a gap comprises monitoring for a gap in the flow of substrates through the track, the lithographic apparatus or both.

27. The method according to claim 25, wherein the gap is determined using information about the performance of a maintenance action, another activity provided by one or more parts of the truck and/or the lithographic apparatus, or both.

28. The method according to claim 25, wherein the gap is determined using a scheduler and the method farther comprises controlling the performance of the one or more maintenance actions in the other oldie track and the lithographic apparatus using the scheduler.

29. The method according to claim 28, wherein said scheduling is performed externally from the lithographic apparatus and the track.

30. The method according to claim 25, wherein the flow of substrates in all or port of the truck, the lithographic apparatus, or both is stopped upon the occurrence of the gap and said scheduling comprises scheduling one or more maintenance action, to be performed in the other of the track and the lithographic apparatus such that the one or more maintenance actions occur at least partly in parallel with the gap.

31. The method according to claim 25, wherein the flow of substrates continues in another part of the substrate processing system upon the occurrence of the gap and said scheduling comprises scheduling one or more maintenance actions to be performed when at least a part of the gap is ar a part of the substrate processing system where the scheduled one or more maintenance actions are to be performed.

* * * * *